(12) United States Patent
Otremba et al.

(10) Patent No.: US 10,763,246 B2
(45) Date of Patent: Sep. 1, 2020

(54) DEVICE INCLUDING A SEMICONDUCTOR CHIP MONOLITHICALLY INTEGRATED WITH A DRIVER CIRCUIT IN A SEMICONDUCTOR MATERIAL

(71) Applicant: Infineon Technologies AG, Neubiberg (DE)

(72) Inventors: Ralf Otremba, Kaufbeuren (DE); Klaus Schiess, Allensbach (DE); Oliver Haeberlen, Villach (AT); Matteo-Alessandro Kutschak, Ludmannsdorf (AT)

(73) Assignee: Infineon Technologies AG, Neubiberg (DE)

( * ) Notice: Subject to any disclaimer, the term of this patent is extended or adjusted under 35 U.S.C. 154(b) by 190 days.

(21) Appl. No.: 15/646,189

(22) Filed: Jul. 11, 2017

(65) Prior Publication Data
US 2017/0317001 A1    Nov. 2, 2017

Related U.S. Application Data

(62) Division of application No. 14/254,139, filed on Apr. 16, 2014, now Pat. No. 9,735,078.

(51) Int. Cl.
*H01L 23/495* (2006.01)
*H01L 25/11* (2006.01)
(Continued)

(52) U.S. Cl.
CPC ........ *H01L 25/115* (2013.01); *H01L 21/4842* (2013.01); *H01L 23/142* (2013.01);
(Continued)

(58) Field of Classification Search
CPC ..... H01L 24/82; H01L 24/97; H01L 25/0652; H01L 25/074; H01L 27/088; H01L 25/00; H01L 25/115; H01L 25/117; H01L 25/162; H01L 23/3157; H01L 24/24; H01L 24/20; H01L 24/48; H01L 24/83; H01L 23/3107; H01L 23/49513; H01L 23/142; H01L 23/49575; H01L 23/3121; H01L 23/5389; H01L 21/4842; H01L 23/49562; H01L 24/19; H01L 25/105; H01L 23/49537; H01L 2224/92244; H01L 2224/8382; H01L 2224/73267; H01L 2224/73263;
(Continued)

(56) References Cited

U.S. PATENT DOCUMENTS 4,798,978 A    1/1989  Lee et al.
6,157,049 A   12/2000  Mitlehner et al.
(Continued)

FOREIGN PATENT DOCUMENTS

CN          1519920 A    8/2004
CN        101794781 A    8/2010
(Continued)

*Primary Examiner* — Shouxiang Hu
(74) *Attorney, Agent, or Firm* — Murphy, Bilak & Homiller, PLLC (57) ABSTRACT

A device includes a driver circuit, a first semiconductor chip monolithically integrated with the driver circuit in a first semiconductor material, and a second semiconductor chip integrated in a second semiconductor material. The second semiconductor material is a compound semiconductor.

19 Claims, 6 Drawing Sheets

(51) Int. Cl.

| | | |
|---|---|---|
| *H01L 25/10* | (2006.01) | |
| *H01L 23/31* | (2006.01) | |
| *H01L 23/00* | (2006.01) | |
| *H01L 23/14* | (2006.01) | |
| *H01L 21/48* | (2006.01) | |
| *H01L 23/538* | (2006.01) | |
| *H01L 25/00* | (2006.01) | |
| *H01L 25/065* | (2006.01) | |
| *H01L 25/16* | (2006.01) | |
| *H01L 27/088* | (2006.01) | |
| *H01L 21/56* | (2006.01) | |

(52) U.S. Cl.
CPC ...... *H01L 23/3107* (2013.01); *H01L 23/3121* (2013.01); *H01L 23/3157* (2013.01); *H01L 23/49513* (2013.01); *H01L 23/49537* (2013.01); *H01L 23/49562* (2013.01); *H01L 23/49575* (2013.01); *H01L 23/5389* (2013.01); *H01L 24/19* (2013.01); *H01L 24/20* (2013.01); *H01L 24/24* (2013.01); *H01L 24/48* (2013.01); *H01L 24/82* (2013.01); *H01L 24/83* (2013.01); *H01L 24/97* (2013.01); *H01L 25/00* (2013.01); *H01L 25/0652* (2013.01); *H01L 25/105* (2013.01); *H01L 25/117* (2013.01); *H01L 25/162* (2013.01); *H01L 27/088* (2013.01); H01L 21/568 (2013.01); H01L 2224/06181 (2013.01); H01L 2224/24175 (2013.01); H01L 2224/24246 (2013.01); H01L 2224/291 (2013.01); H01L 2224/2919 (2013.01); H01L 2224/32225 (2013.01); H01L 2224/32245 (2013.01); H01L 2224/40137 (2013.01); H01L 2224/45015 (2013.01); H01L 2224/45124 (2013.01); H01L 2224/45144 (2013.01); H01L 2224/45147 (2013.01); H01L 2224/48137 (2013.01); H01L 2224/73263 (2013.01); H01L 2224/73267 (2013.01); H01L 2224/8382 (2013.01); H01L 2224/92244 (2013.01); H01L 2225/1029 (2013.01); H01L 2225/1047 (2013.01); H01L 2924/00 (2013.01); H01L 2924/1033 (2013.01); H01L 2924/10253 (2013.01); H01L 2924/13055 (2013.01); H01L 2924/13064 (2013.01); H01L 2924/13091 (2013.01)

(58) Field of Classification Search
CPC . H01L 2224/48137; H01L 2224/45147; H01L 2224/45144; H01L 2224/45124; H01L 2224/45015; H01L 2224/32245; H01L 2224/32225; H01L 2224/2919
See application file for complete search history.

(56) References Cited

U.S. PATENT DOCUMENTS

| | | | |
|---|---|---|---|
| 6,188,127 B1 | 2/2001 | Senba et al. | |
| 6,741,099 B1 | 5/2004 | Krugly | |
| 7,408,399 B2 | 8/2008 | Salato et al. | |
| 7,777,553 B2 | 8/2010 | Friedrichs | |
| 8,022,522 B1 | 9/2011 | Liou et al. | |
| 2002/0027276 A1 | 3/2002 | Sakamoto et al. | |
| 2002/0191428 A1* | 12/2002 | Loef | H02M 1/4241 363/98 |
| 2008/0106879 A1 | 5/2008 | Ryu et al. | |
| 2008/0296782 A1 | 12/2008 | Otremba et al. | |
| 2009/0026601 A1 | 1/2009 | Otremba et al. | |
| 2009/0189259 A1 | 7/2009 | Mohamed et al. | |
| 2010/0032816 A1 | 2/2010 | Mahler et al. | |
| 2010/0297810 A1 | 11/2010 | Otremba et al. | |
| 2011/0165735 A1 | 7/2011 | Wachtler et al. | |
| 2011/0254018 A1* | 10/2011 | Domes | H03K 17/063 257/77 |
| 2012/0214277 A1 | 8/2012 | Josef Poeppel et al. | |
| 2013/0154123 A1 | 6/2013 | Poh et al. | |
| 2013/0234308 A1* | 9/2013 | Yamada | H01L 21/78 257/676 |
| 2013/0265029 A1 | 10/2013 | Akiyama | |
| 2014/0252577 A1 | 9/2014 | Otremba et al. | |
| 2016/0167953 A1* | 6/2016 | Gogoi | H01L 27/14 257/414 |

FOREIGN PATENT DOCUMENTS

| | | |
|---|---|---|
| CN | 103367338 A | 10/2013 |
| DE | 19610135 C1 | 6/1997 |
| DE | 102005034012 A1 | 11/2006 |
| DE | 102012111788 A1 | 6/2013 |
| WO | 2006060337 A2 | 6/2006 |

\* cited by examiner

Fig. 9

DEVICE INCLUDING A SEMICONDUCTOR CHIP MONOLITHICALLY INTEGRATED WITH A DRIVER CIRCUIT IN A SEMICONDUCTOR MATERIAL

TECHNICAL FIELD

The disclosure relates to devices including multiple semiconductor chips and multiple carriers. In addition, the disclosure relates to methods for manufacturing such devices.

BACKGROUND

A device may include multiple semiconductor chips that may interact during an operation of the device. The design of the device and the chosen arrangement of the semiconductor chips may affect a performance of the device. Semiconductor devices and methods for manufacturing semiconductor devices constantly have to be improved. In particular, it may be desirable to improve a thermal and electrical performance of the semiconductor devices.

SUMMARY

According to an embodiment, a device includes a first semiconductor chip arranged over a first carrier and a first electrical contact. The device further includes a second semiconductor chip arranged over a second carrier. The second semiconductor chip includes a second electrical contact arranged over a surface of the second semiconductor chip. The second electrical contact faces the second carrier. The second carrier is electrically coupled to the first electrical contact and the second electrical contact.

According to an embodiment, a device includes a first semiconductor chip arranged over a first carrier and an encapsulation material at least partly encapsulating the first semiconductor chip. A laminate is arranged over the encapsulation material. A second carrier is at least partly embedded in the laminate. A second semiconductor chip is arranged over the second carrier and the laminate.

According to an embodiment, a device includes a driver circuit and a first semiconductor chip. The driver circuit and the first semiconductor chip are monolithically integrated in a first semiconductor material. The device further includes a second semiconductor chip integrated in a second semiconductor material, wherein the second semiconductor material comprises a compound semiconductor.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference numerals may designate corresponding similar parts.

DETAILED DESCRIPTION

In the following detailed description, reference is made to the accompanying drawings, which form a part hereof, and in which is shown by way of illustration specific aspects in which the disclosure may be practiced. In this regard, directional terminology, such as "top," "bottom," "front," "back," etc., may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the scope of the present disclosure. Hence, the following detailed description is not to be taken in a limiting sense, and the scope of the present disclosure is defined by the appended claims.

As employed in this specification, the terms "connected," "coupled," "electrically connected" and/or "electrically coupled" are not meant to necessarily mean that elements must be directly connected or coupled together. Intervening elements may be provided between the "connected," "coupled," "electrically connected" or "electrically coupled" elements.

Further, the word "over" used with regard to e.g. a material layer formed or located "over" a surface of an object may be used herein to mean that the material layer may be located (e.g. formed, deposited, etc.) "directly on," e.g. in direct contact with, the implied surface. The word "over" used with regard to e.g. a material layer formed or located "over" a surface may also be used herein to mean that the material layer may be located (e.g. formed, deposited, etc.) "indirectly on" the implied surface with e.g. one or more additional layers being arranged between the implied surface and the material layer.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures. In addition, the features of the various exemplary aspects described herein may be combined with each other, unless specifically noted otherwise.

The devices described herein may include one or more semiconductor chips and thus may also be referred to as semiconductor devices. The semiconductor chips may be of different types and may be manufactured by different technologies. For example, the semiconductor chips may include integrated electrical, electrooptical or electromechanical circuits, passives, etc. The integrated circuits may be designed as logic integrated circuits, analog integrated circuits, mixed signal integrated circuits, power integrated circuits, memory circuits, integrated passives, microelectromechanical systems, etc. The semiconductor chips need not be manufactured from specific semiconductor material and may contain inorganic and/or organic materials that are not semiconductors, such as, for example, insulators, plastics or metals. In one example, the semiconductor chips may be made of or may include an elemental semiconductor material, for example Si, etc. In a further example, the semiconductor chips may be made of or may include a compound semiconductor material, for example SiC, SiGe, GaAs, etc.

The semiconductor chips may include one or more power semiconductors. For example, the power semiconductor chips may be configured as diodes, power MOSFETs (Metal Oxide Semiconductor Field Effect Transistors), IGBTs (Insulated Gate Bipolar Transistors), JFETs (Junction Gate Field Effect Transistors), super junction devices, power bipolar transistors, etc. The devices described herein may further include semiconductor chips or integrated circuits configured to control and/or drive the integrated circuits of the power semiconductor chips.

The semiconductor chips may have a vertical structure, i.e. the semiconductor chips may be fabricated such that electric currents may substantially flow in a direction perpendicular to the main faces of the semiconductor chips. A semiconductor chip having a vertical structure may have electrodes over its two main faces, i.e. over its top side and bottom side. In particular, power semiconductor chips may have a vertical structure and may have load electrodes arranged over both main faces. The source electrode and gate electrode of a power MOSFET may be arranged over one face while the drain electrode of the power MOSFET may be arranged over the other face. Examples for a vertical power semiconductor chip are a PMOS (P-Channel Metal Oxide semiconductor), an NMOS (N-Channel Metal Oxide semiconductor), or one of the exemplary power semiconductors specified above.

The semiconductor chips may have a lateral structure, i.e. the semiconductor chips may be fabricated such that electric currents may substantially flow in a direction parallel to a main face of the semiconductor chips. A semiconductor chip having a lateral structure may have electrodes arranged over one of its main faces. In one example, a semiconductor chip having a lateral structure may include an integrated circuit, such as e.g. a logic chip. In a further example, a power semiconductor chip may have a lateral structure, wherein the load electrodes may be arranged over one main face of the chip. For example, the source electrode, the gate electrode and the drain electrode of a power MOSFET may be arranged over one main face of the power MOSFET. A further example of a lateral power semiconductor chip may be a HEMT (High Electron Mobility Transistor) that may be fabricated from one of the above mentioned compound semiconductor materials.

The semiconductor chips may be packaged or unpackaged. In this regard, the terms "semiconductor device" and "semiconductor package" as used in this specification may be interchangeably used. In particular, a semiconductor package may be a semiconductor device including an encapsulation material that may at least partly encapsulate one or more components of the semiconductor device.

The semiconductor chips may include a varying number of electrical contacts. The electrical contacts may be arranged in a varying geometry over one or more surfaces of the semiconductor chip depending on the type of the considered device. In one example, the electrical contacts may be arranged over the frontside and the backside of the semiconductor chip. Such semiconductor chip may, for example, correspond to a power semiconductor chip that may include a drain contact arranged on one side of the semiconductor chip, as well as a source contact and a gate contact arranged over the opposite side of the semiconductor chip. In a further example, the electrical contacts may be exclusively arranged over the frontside of the semiconductor chip. For example, such a semiconductor chip may be referred to as lateral chip and may e.g. correspond to a discrete semiconductor chip. For example, an electrical contact may be located directly over an electronic structure of a semiconductor chip such that no further redistribution layer may be required when providing an electrical connection between the electrical contact and the electronic structure. Alternatively, an electrical contact may be connected to the electronic structure via one or more additional redistribution layers.

An electrical contact may have the form of a contact pad (or a contact element or a contact terminal or a contact electrode). A contact pad may include one or more layers, each of which may include at least one of a metal and a metal alloy. For example, a contact pad may be applied to the semiconductor material of a semiconductor chip. The layers may be manufactured with any desired geometric shape and any desired material composition. Any desired metal or metal alloy, for example, aluminum, titanium, gold, silver, copper, palladium, platinum, nickel, chromium, vanadium, tungsten, molybdenum, etc., may be used as a material. The layers need not be homogeneous or manufactured from just one material, i.e. various compositions and concentrations of the materials included in the layers may be possible. Any appropriate technique may be used for manufacturing the contact pad or the layers forming the contact pad. For example, an electroless plating process may be used.

The devices described herein may include a carrier over which one or more semiconductor chips may be arranged. The devices are not restricted to only include one single carrier, but may also include multiple carriers. In general, a carrier may be manufactured from a metal, an alloy, a dielectric, a plastic, a ceramic, or a combination thereof. The carrier may have a homogeneous structure, but may also provide internal structures like conducting paths with an electric redistribution function. In addition, a footprint of the carrier may depend on a number and footprints of semiconductor chips that are to be arranged over the carrier. That is, the carrier may particularly include mounting areas configured to carry semiconductor chips. Examples for carriers may be a die pad, a lead frame including a die pad, or a ceramic substrate including one or more redistribution layers.

In one example, a carrier may include a leadframe that may be of any shape, any size and any material. The leadframe may be structured such that die pads (or chip islands) and leads may be formed. During a fabrication of a device, the die pads and the leads may be connected to each other. The die pads and the leads may also be made from one piece. The die pads and the leads may be connected among each other by connection means with the purpose of separating some of the die pads and the leads in the course of the fabrication. Here, separating the die pads and the leads may be carried out by at least one of mechanical sawing, a laser beam, cutting, stamping, milling, etching, and any other appropriate technique. In particular, a leadframe may be electrically conductive. For example, the leadframe may be entirely fabricated from metals and/or metal alloys, in particular at least one of copper, copper alloys, nickel, iron nickel, aluminum, aluminum alloys, steel, stainless steel, and other appropriate materials. The leadframe material may include traces of iron, sulfur, iron nitride, etc. The leadframe may be plated with an electrically conductive material, for example at least one of copper, silver, palladium, gold, nickel, iron nickel, and nickel phosphorus. In this case, the leadframe may be referred to as "pre-plated leadframe." Even though a leadframe may be electrically conductive, a selection of die pads of the leadframe may be electrically insulated from each other.

A shape, size and/or material of a leadframe may depend on the semiconductor chip(s) that may be arranged over the leadframe. In one example, a compound semiconductor chip, such as a lateral GaN chip, may be arranged over the leadframe. In this case, the leadframe may be made of or may include aluminum and/or an aluminum alloy. Such leadframe may have a thickness from about 1 millimeter to about 5 millimeter, more particular from about 1 millimeter to about 2 millimeter. For example, the leadframe may be connected to a heat sink that may be made of a similar material. In a further example, a low voltage MOS may be arranged over the leadframe. In this case, the leadframe may be made of or may include copper and/or a copper alloy and may further include traces of iron and/or sulfur. Such leadframe may have a thickness from about 0.1 millimeter to about 0.5 millimeter, more particular from about 0.2 millimeter to about 0.3 millimeter.

A carrier (or a leadframe) may be at least partly embedded in a laminate. A thickness of the laminate may be equal or greater than a thickness of the leadframe embedded in the laminate. The material of the laminate may be similar to an encapsulation material as specified below such that comments made in this connection may apply to the laminate as well. A laminate including one or more leadframes may be attached to a further component of a device, for example to an encapsulation material. The laminate may be attached to the further component by applying at least one of laminating, gluing, agglomerating, etc. After attaching the laminate, it may provide a mechanical connection between the carrier included in the laminate and the component over which the laminate has been arranged.

The devices described herein may include one or more electrically conductive elements configured to provide an electrical coupling between components of the devices. For example, the electrically conductive element may be configured to electrically connect a first semiconductor chip and a second semiconductor chip or to provide an electrical connection between a semiconductor chip and a further component that may be arranged inside or outside of the device.

An electrically conductive element may include one or more contact clips. A contact clip may be made of or may include a material similar to the material of a leadframe such that above comments made in connection with a leadframe may also hold true for the contact clip. The shape of the contact clip is not necessarily limited to a specific size or a specific geometric shape. The contact clip may be fabricated by at least one of stamping, punching, pressing, cutting, sawing, milling, and any other appropriate technique. A contact between the electrically conductive element and a contact pad of a semiconductor chip may be established by any appropriate technique. In one example, the electrically conductive element may be soldered to other components, for example by employing a diffusion soldering process.

An electrically conductive element may include one or more wires, in particular bond wires or bonding wires. A wire may include a metal and/or a metal alloy, in particular gold, aluminum, copper, or one or more of their alloys. In addition, the wire may or may not include a coating. The wire may have a substantially circular cross section such that the term "thickness" of the wire may refer to the diameter of the bond wire. However, it is understood that the wire may also have a cross section of different form. In general, a wire may have a thickness from about 15 μm (micrometer) to about 1000 μm (micrometer), and more particular a thickness of about 50 μm (micrometer) to about 500 μm (micrometer).

In a first more particular example, the wire may have a thickness smaller than 75 μm (micrometer), for example a thickness from about 50 μm (micrometer) to about 75 μm (micrometer). Such wire may particularly include or be made of aluminum. The wire may include further materials, for example up to 1% silicon. For example, such wire may provide an electrical connection between a contact element and a gate electrode of a power semiconductor chip and/or between gate electrodes of two different power semiconductor chips. In a second more particular example, the wire may have a thickness from about 125 μm (micrometer) to about 500 μm (micrometer). Such wire may be particularly employed to provide an electrical connection between a contact element and a source electrode of a power semiconductor chip.

The devices described herein may include one or more redistribution layers. For example, a redistribution layer may be arranged over a main surface of a semiconductor chip including contact pads. A redistribution layer may include one or more metal layers that may have the shape of conductor lines or conductor planes and may be electrically coupled to the contact pads of a semiconductor chip of the device. The metal layers may be used as wiring layers to provide electrical contact with the semiconductor chips from outside the device and/or to provide electrical contact with other semiconductor chips and/or components included in the device. The metal layers may electrically couple the contact pads of the semiconductor chips to external contact pads. The metal layers may be manufactured with any desired geometric shape and any desired material composition. For example, the metal layers may include at least one of aluminum, nickel, palladium, silver, tin, gold, copper, corresponding metal alloys, etc., and combinations thereof. The metal layers may include one or multiple single metal layers made of these materials. Alternatively or additionally, the metal layers may include one or multiple multilayers made of the materials, for example copper/nickel/gold. The metal layers may be arranged above or below or between electrically insulating layers. For example, a connection between metal layers arranged on different levels may be established by one or more via connections (or through connections) that may be made of a similar material.

The devices described herein may include an encapsulation material that may at least partly cover one or more components of a device. The encapsulation material may be electrically insulating and may form an encapsulation body. The encapsulation material may include at least one of an epoxy, a glass fiber filled epoxy, a glass fiber filled polymer, an imide, a filled or non-filled thermoplastic polymer material, a filled or non-filled duroplastic polymer material, a filled or non-filled polymer blend, a thermosetting material, a mold compound, a glob-top material, a laminate material, etc. Various techniques may be used to encapsulate components of the device with the encapsulation material, for example at least one of compression molding, injection molding, powder molding, liquid molding, lamination, etc.

The devices described herein may include one or more driver circuits (or drivers) that may be implemented in a semiconductor material. A driver circuit may include one or more electrical circuits or electrical components that may be configured to drive (or control) one or more components or circuits, for example a high-power transistor that may also be included in the device. The driven components may be voltage driven or current driven. For example, Power MOSFETs, IGBTs, etc., may be voltage driven switches, since their insulated gate may particularly behave like a capacitor. Conversely, switches such as triacs (triode for alternating current), thyristors, bipolar transistors, a PN diode, etc., may be current driven. In one example, driving a component including a gate electrode may include applying different voltages to the gate electrode, e.g. in form of turn-on and turn-off switching wave forms. In a further example, a driver circuit may be used to drive a direct driven circuit.

The devices described herein may include one or more control circuits (or controllers) that may be implemented in a semiconductor material. A control circuit may include one or more electrical circuits or electrical components that may be configured to control one or more components or circuits that may also be included in the device. A control circuit may be configured to control one or more drivers driving components of the device. In one example, a control circuit may simultaneously control drivers of multiple direct driven circuits. For example, a half bridge circuit including two direct driven circuits may thus be controlled by a controller. A controller may e.g. include a micro controller.

Figure 1:
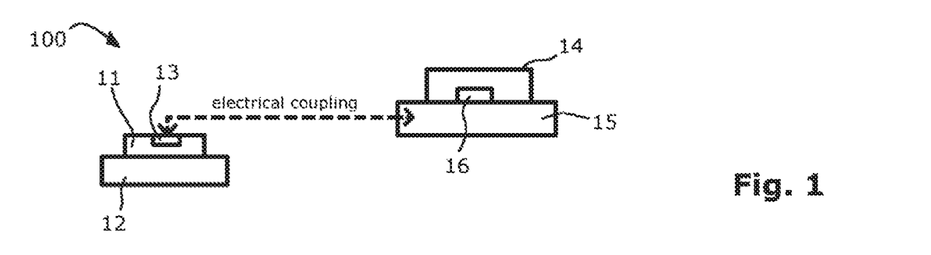
FIG. 1 schematically illustrates a cross-sectional view of a device in accordance with the disclosure.

FIG. 1 schematically illustrates a cross-sectional view of a device 100 in accordance with the disclosure. In the example of FIG. 1, the device 100 is illustrated in a general manner and may include further components that are not illustrated for the sake of simplicity. For example, the device 100 may further include one or more components of other devices in accordance with the disclosure. More detailed devices similar to the device 100 are described below.

The device 100 may include a first semiconductor chip 11 that may be arranged over a first carrier 12. The first semiconductor chip 11 may include a first electrical contact 13. In the example of FIG. 1, the first electrical contact 13 may be arranged over a surface of the first semiconductor chip 11 that may face away from the first carrier 12. In further examples, the first electrical contact 13 may also be arranged at a different location, for example over a surface of the first semiconductor chip 11 facing the first carrier 12. The device 100 may further include a second semiconductor chip 14 that may be arranged over a second carrier 15. The second semiconductor chip 14 may include a second electrical contact 16 that may be arranged over a surface of the second semiconductor chip 14 facing the second carrier 15. The second carrier 15 may be electrically coupled to the first electrical contact 13 and to the second electrical contact 16. The electrical coupling between the second carrier 15 and the electrical contacts 13 and 16 may be established in various ways and is not restricted to one specific example. In FIG. 1, the electrical coupling between the second carrier 15 and the first electrical contact 13 is thus qualitatively indicated by a dashed line, but no specific implementation is illustrated for the sake of simplicity. Examples for suitable electrical couplings between the components are provided below.

Figure 2:
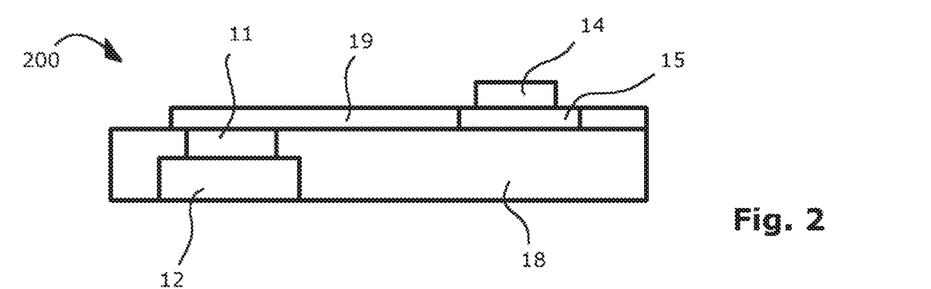
FIG. 2 schematically illustrates a cross-sectional view of a device in accordance with the disclosure.

FIG. 2 schematically illustrates a cross-sectional view of a device 200 in accordance with the disclosure. The device 200 may include a first semiconductor chip 11 that may be arranged over a first carrier 12. The device 200 may further include an encapsulation material 18 that may at least partly encapsulate the first semiconductor chip 1. In addition, the device 200 may include a laminate 19 that may be arranged over the encapsulation material 18. A second carrier 15 may at least partly be embedded in the laminate 19. The device 200 may also include a second semiconductor chip 14 that may be arranged over the second carrier 15 and over the laminate 19. More detailed devices similar to the device 200 are described below.

Figure 3A:
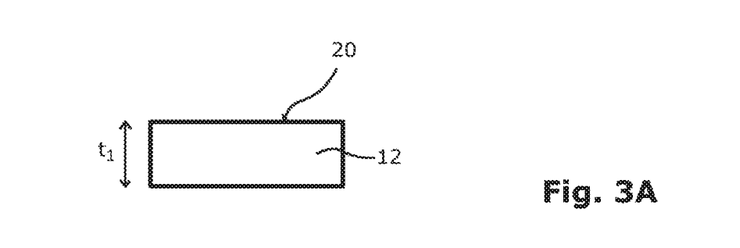
FIGS. 3A to 3G schematically illustrate a cross-sectional view of a method for manufacturing a device in accordance with the disclosure.
Figure 3B:
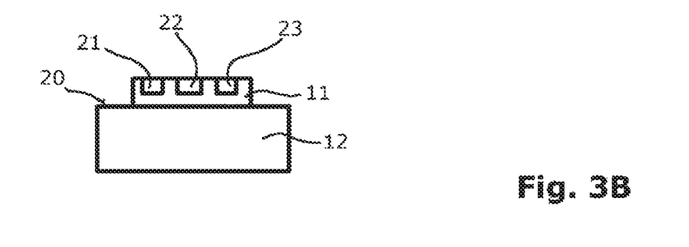
Figure 3C:
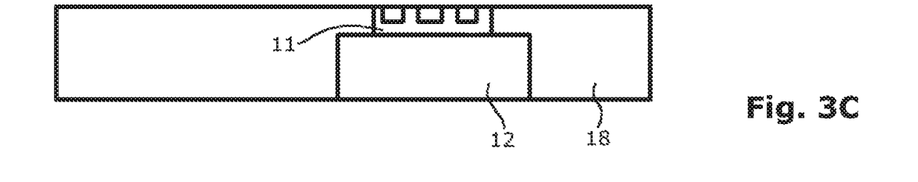
Figure 3D:
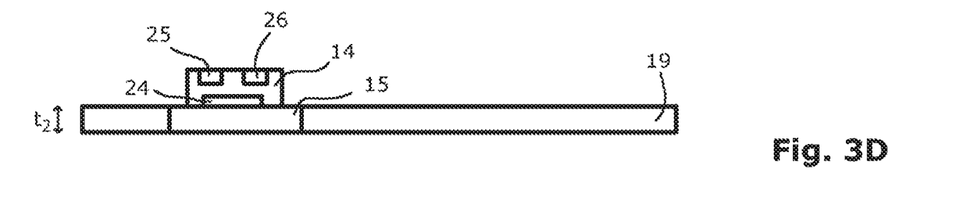
Figure 3E:
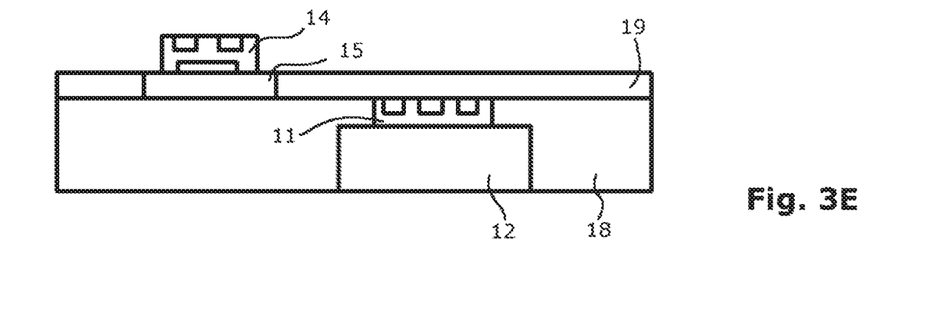
Figure 3F:
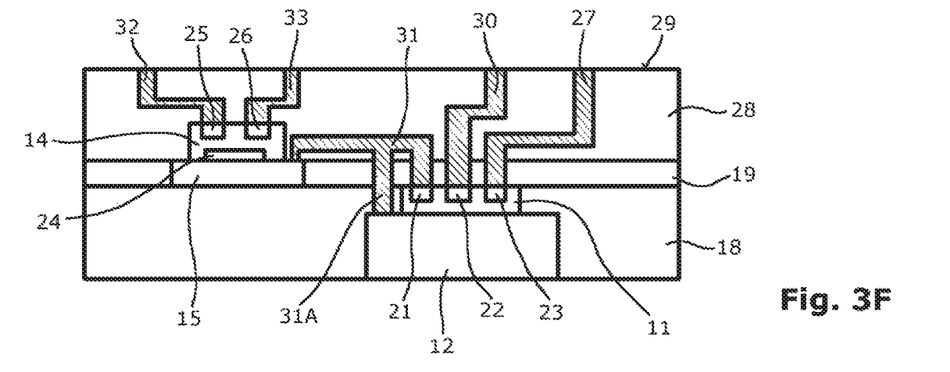
Figure 3G:
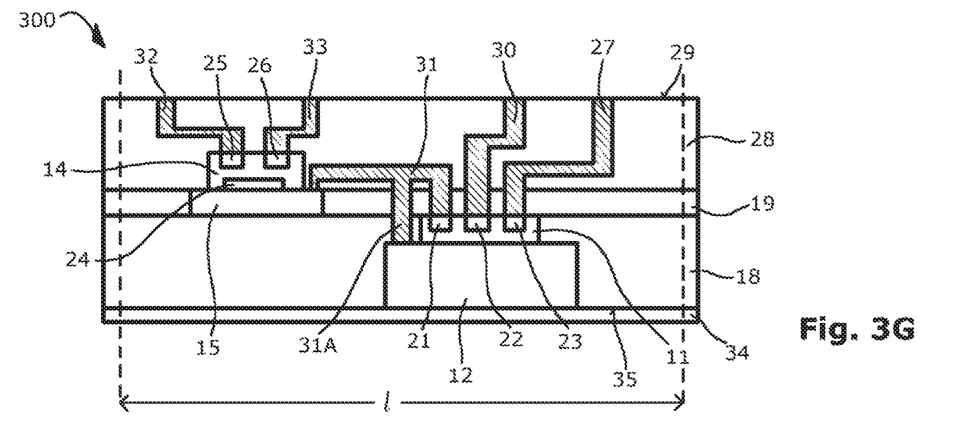

FIGS. 3A to 3G schematically illustrate a method for manufacturing a device 300, a cross section of which is shown in FIG. 3G. The device 300 may be seen as an implementation of the devices 100 and 200 such that details of the device 300 described below may be likewise applied to the devices 100 and 200. FIGS. 3A to 3G illustrate the manufacturing of one device 300. However, a greater number of similar devices may be manufactured simultaneously. Each act as shown in FIGS. 3A to 3G may be performed for a multiple number of similar arrangements shown in the figures. The multiple arrangements to be processed may e.g. be placed in a side by side manner, for example to the left and to the right of the arrangements shown in the FIGS. 3A to 3G.

In FIG. 3A, a first carrier 12 may be provided. For example, the first carrier 12 may correspond to a leadframe that may include one or more die pads and/or one or more leads that may or may not be connected to the die pad(s). The first carrier 12 may be made of or may include at least one of aluminum and an aluminum alloy. Further, the first carrier 12 may have a thickness $t_1$ from about 1 millimeter to about 5 millimeter, more particular from about 1 millimeter to about 2 millimeter. An upper surface 20 of the first carrier 12 may have a surface area that may be large enough such that a compound semiconductor chip, for example a GaN semiconductor chip, may be arranged over the upper surface 20. A GaN semiconductor chip may have a surface area from about 1 $mm^2$ to about 4 $mm^2$, more particular from about 2 $mm^2$ to about 3 $mm^2$. When multiple devices are to be manufactured, a corresponding number of multiple similar carriers (not illustrated) may be arranged in a side by side manner. The further carriers may then become part of the additional devices to be manufactured.

In FIG. 3B, a first semiconductor chip 11 may be arranged over the upper surface 20 of the first carrier 12. The first semiconductor chip 11 may be attached to the first carrier 12 by using any appropriate technique and material, for example by means of a diffusion solder, a glue, an adhesive, etc. The first semiconductor chip 11 and the first carrier 12 may be electrically coupled or may be electrically insulated from each other depending on the desired functionality of the device 300 that is to be manufactured. In the example of FIG. 3B, the first semiconductor chip 11 may correspond to a lateral compound semiconductor chip, for example a GaN HEMT. The first semiconductor chip 11 may include electrical contacts that may be arranged over a surface of the first semiconductor chip 11 that may face away from the first carrier 12. In the example of FIG. 3B, the electrical contacts may include a source electrode 21, a gate electrode 22, and a drain electrode 23.

In FIG. 3C, the first carrier 12 and the first semiconductor chip 11 may be at least partly encapsulated by an encapsulation material 18. For example, the first carrier 12 and the first semiconductor chip 11 may be placed into a molding tool, wherein the lower surface of the first carrier 12 and the upper surface of the first semiconductor chip 11 including the electrical contacts may at least partly be covered by the molding tool. The encapsulation material 18 may then be injected into the molding tool, thereby forming an encapsulation body 18 as illustrated in FIG. 3C. Here, the lower surface of the first carrier 12 and the upper surface of the first semiconductor chip 11 may remain exposed from the encapsulation material 18. The lower surface of the first carrier 12 and the lower surface of the encapsulation material 18 may be arranged in a common plane. Similarly, the upper surface of the first semiconductor chip 11 and the upper surface of the encapsulation material 18 may be arranged in a common plane as well.

In FIG. 3D, a laminate 19 may be provided. The laminate 19 may include a second carrier 15 that may be at least partly embedded in the laminate 19. The second carrier 15 may correspond to a leadframe that may include one or multiple die pads and/or one or multiple leads that may or may not be connected to the die pad(s). At least a part of the second carrier 15 may be electrically conductive. In one example, the second carrier 15 may be made of or may include copper and/or a copper alloy and may further include traces of iron and/or sulfur. The second carrier 15 may have a thickness $t_2$ from about 0.1 millimeter to about 0.5 millimeter, more particular from about 0.2 millimeter to about 0.3 millimeter. Depending on the functionality of the device 300 to be manufactured and the number of semiconductor chips included in the device 300, the laminate 19 may include further carriers that are not illustrated for the sake of simplicity.

A second semiconductor chip 14 may be arranged over the second carrier 15. The second semiconductor chip 14 may be attached to the second carrier 15 by any appropriate technique and material, for example by means of a diffusion solder, a glue, an adhesive, etc. For example, the second semiconductor chip 14 may correspond to a vertical power semiconductor chip that may include electrical contacts arranged over its main surfaces. For example, the second semiconductor chip 14 may be a low voltage NMOS chip. In the example of FIG. 3D, the electrical contacts may include a drain electrode 24 that may be arranged over a main surface of the second semiconductor chip 14 facing the second carrier 15. Hence, an electrical coupling between the drain electrode 24 and the second carrier 15 may be established. In addition, the electrical contacts may include a gate electrode 25 and a source electrode 26 that may be arranged over a main surface of the second semiconductor chip 14 facing away from the second carrier 15.

In FIG. 3E, the laminate 19 including the second carrier 15 may be arranged over the encapsulation material 18. In particular, the laminate 19 may be arranged such that the second semiconductor chip 14 may be at least partly located laterally outside of an outline of the first semiconductor chip 11. In addition, due to the positioning of the laminate 19, the main surfaces of the first semiconductor chip 11 and the main surfaces of the second semiconductor chip 14 may be arranged on different levels. The laminate 19 may provide a mechanical connection between the encapsulation material 18 and the second carrier 15 and/or between the encapsulation material 18 and the laminate 19. In one example, the mechanical connection may be provided by placing the laminate 19 onto the encapsulation material 18 and exposing the arrangement to an increased temperature such that the laminate 19 and the encapsulation material 18 may at least partly become agglomerated. For this purpose, the arrangement may e.g. be placed inside an oven that may be configured to provide a temperature required for an agglomeration of the materials to be mechanically connected. In further examples, the mechanical connection may be provided by applying at least one of laminating, gluing, etc.

In FIG. 3F, one or multiple redistribution layers may be formed over the first semiconductor chip 11 and over the second semiconductor chip 14. The redistribution layers may include one or multiple electrically conductive layers as well as one or more electrically insulating layers that may be arranged between the electrically conductive layers. Stacked electrically conductive layers may be electrically coupled with each other by electrically conductive via connections (or through connections). In particular, the individual layers of the redistribution layers may be formed based on a planar technique, wherein the layers may be deposited in form of planar layers.

The electrically conductive layers included in the redistribution layers may be deposited by using sputtering, electroless deposition, evaporation or any other appropriate technique. The electrically conductive layers may include or may be made of at least one of aluminum, nickel, palladium, titanium, titanium tungsten, silver, tin, gold, molybdenum, vanadium or copper, and metal alloys. For example, the electrically conductive layers may be structured by applying etching techniques. Here, etch resist layers may be appropriately structured, wherein portions of the electrically conductive layers, which are not covered by the respective etch resist layer, may be removed by an etching step such that a structured electrically conductive layer may be provided.

The electrically insulating layers included in the redistribution layers may be deposited from a gas phase or from a solution or they may be laminated over respective surfaces. In addition or alternatively, a thin-film technology or a standard PCB industry process flow may be used for an application of the electrically insulating layers. The electrically insulating layers may be fabricated from a polymer, e.g. polynorbomene, parylene, photoresist material, imide, epoxy, duroplast, silicone, silicon nitride, silicon oxide or an inorganic, ceramic-like material, such as silicone-carbon compounds. The thickness of an electrically insulating layer may be up to 10 μm (micrometer) or even higher. The electrically insulating layers may be structured and may be opened at locations where electrical through connections are to be provided. By way of example, the structuring of the electrically insulating layers and the openings in the electrically insulating layers may be provided by using at least one of photolithographic methods, etching methods, laser drilling, etc.

A first redistribution layer may include one or more electrically conductive connections each of which may include one or more electrically conductive layers and one or more electrically conductive via connections. The electrically conductive connections of the first redistribution layer may be particularly coupled to the electrical contacts of the first semiconductor chip 11. In the example of FIG. 3F, the electrically conductive connections are illustrated in a simplified manner. That is, not all of the conductive layers and via connections that may be included in a respective electrically conductive connection may be explicitly shown.

An electrically conductive connection 27 may extend through the laminate 19 and electrically insulating layers 28 of the redistribution layer from the drain electrode 23 to an upper surface 29 of the illustrated arrangement. It may thus be possible to electrically contact the drain electrode 23 via the electrically conductive connection 27. A further electrically conductive connection 30 may extend through the laminate 19 and the electrically insulating layers 28 of the redistribution layer from the gate electrode 22 to the upper surface 29 of the illustrated arrangement. The gate electrode 22 may thus be electrically contacted via the electrically conductive connection 30. A further electrically conductive connection 31 may provide an electrical coupling between the source electrode 21 of the first semiconductor chip 11 and the second carrier 15. In addition, the electrically conductive connection 31 may provide an electrical coupling between the source electrode 21 and the first carrier 12 such that the first carrier 12 may be set to an electrical potential. In the example of FIG. 3F, the electrically conductive connection 31 may include a via connection 31A that may be electrically coupled to the first carrier 12 and the second carrier 15.

A second redistribution layer may include one or more electrically conductive connections each of which may include one or more electrically conductive layers and one or more electrically conductive via connections. The electrically conductive connections of the second redistribution layer may be particularly coupled to the electrical contacts of the second semiconductor chip 14. In the example of FIG. 3F, the electrically conductive connections are illustrated in a simplified manner, i.e. not all of the conductive layers and via connections that may be included in a respective electrically conductive connection may be explicitly shown.

An electrically conductive connection 32 may extend through the electrically insulating layers 28 of the redistribution layer from the gate electrode 25 of the second semiconductor chip 14 to the upper surface 29 of the arrangement. Thus, the gate electrode 25 may be electrically contacted via the electrically conductive connection 32. A further electrically conductive connection 33 may extend through the electrically insulating layers 28 of the redistribution layer from the source electrode 26 to the upper surface 29 of the redistribution layer. The source electrode 26 may thus be electrically contacted via the electrically conductor connection 33. The electrically conductive connection 31 described above may be regarded as a further part of the second redistribution layer. The electrically conductive connection 31 may provide an electrical coupling to the second carrier 15, which may be electrically coupled to the drain electrode 24 of the second semiconductor chip 14. It is thus possible to electrically contact the drain electrode 24 via the electrically conductive connection 31. The source electrode 21 of the first semiconductor chip 11 may be electrically coupled to the drain electrode 24 of the second semiconductor chip 14 via the second carrier 15 and the electrically conductive connection 31.

In one example, the surfaces of the electrically conductive connections exposed on the upper surface 29 of the arrangement may serve as contact pads when the arrangement may be arranged over an external component later on, for example over a PCB. In a further example, additional contact elements may be arranged over the exposed surfaces of the electrically conductive connections, for example solder balls, solder depots, etc.

In FIG. 3G, a dielectric layer 34 may be arranged over a lower surface 35 of the arrangement. The dielectric layer 34 may be configured to electrically insulate the first carrier 12 from other components. The dielectric layer 34 may include or may be made of a material similar to the encapsulation material 18. The materials of the dielectric layer 34 and the encapsulation material 18 may be identical or not. Any appropriate technique may be used for depositing the dielectric layer 34 over the lower surface 35, for example at least one of laminating, squeegeeing, printing, dispensing, spin-coating, applying adhesive foils, etc.

The method described in connection with FIGS. 3A and 3G may include further acts that are not explicitly illustrated for the sake of simplicity. For example, the acts of FIGS. 3A to 3G may have been performed for multiple similar arrangements arranged in a side by side manner. After performing the described acts on the multiple arrangements, the arrangements may be singulated by separating the individual fabricated devices at locations that are indicated in FIG. 3G by dashed lines. Any suitable technique may be used for separating the manufactured devices, for example at least one of sawing, laser dicing, wet etching, plasma etching, etc. The singulated device 300 may have a length l from about 5 millimeter to about 13 millimeter, more particular from about 8 millimeter to about 10 millimeter. During an operation of the device 300, leakage currents may occur at the side surfaces where the device 300 may have been separated. Due to the thickness $t_1$ of the first carrier 12 a leakage path for such leakage currents may be increased.

The redistribution layers arranged over the semiconductor chips 11 and 14 may provide a fan-out structure in which the electrical contacts over the upper surface 29 of the device 300 may at least partly lie outside of an outline of the respective one of the semiconductor chips 11, 14. For example, an electrically conductive layer of a redistribution layer may extend over an outline of a semiconductor chip for more than 1 millimeter or more than 2 millimeters or more than 3 millimeters. For example, the shape of the singulated device 300 in a top plan view may be quadratic or rectangular. The separated device 300 may be processed by further acts which are not illustrated for the sake of simplicity. The separated device 300 may be electrically coupled to other electronic components, for example it may be mounted on a PCB.

The device 300 of FIG. 3G may be configured to operate as a direct driven circuit. An exemplary schematic diagram of a direct driven circuit 600 is provided in FIG. 6. For example, such direct driven circuit may include a compound semiconductor chip, e.g. a GaN HEMT, and a low voltage Power MOS, e.g. an NMOS. When using the device 300 of FIG. 3G as a direct driven circuit, the first semiconductor chip 11 may include the compound semiconductor chip while the second semiconductor chip 14 may include the low voltage Power MOS. In further examples, devices similar to the device 300 of FIG. 3G may be configured to operate as full bridge circuits, half bridge circuit, cascode circuits, etc.

Figure 4:
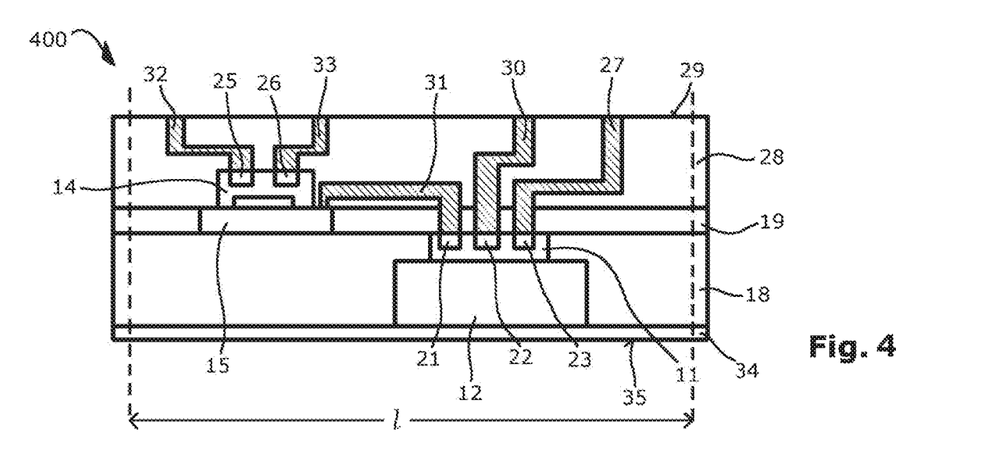
FIG. 4 schematically illustrates a cross-sectional view of a device in accordance with the disclosure.

FIG. 4 schematically illustrates a cross-sectional view of a device 400 in accordance with the disclosure. The device 400 may be similar to the device 300 of FIG. 3G. Comments made in connection with FIGS. 3A to 3G may therefore also hold true for FIG. 4. In contrast to the device 300 of FIG. 3, the device 400 may not necessarily include an electrical connection between the first carrier 12 and the electrically conductive layers of the redistribution layers. In FIG. 4, the through connection 31A of the device 300 electrically coupling the first carrier 12 and the electrically conductive layer 31 is missing. Hence, the first carrier 12 of the device 400 may not necessarily have an electrical function. However, the first carrier 12 may support a dissipation of heat in a direction away from the first semiconductor chip 11 and may thus have a thermal function. Since the thickness $t_1$ of the first carrier 12 and the thickness t2 of the second carrier 15 may differ, a heat transport via the carriers 12, 15 in a vertical direction away from the semiconductor chips 11, 14 may differ as well. In particular, a first transport of heat via the first carrier 12 in a vertical direction may be larger than a second transport of heat via the second carrier 15 in a vertical direction. For example, a ratio between the first heat transport and the second heat transport may be larger than a value of two, more particular larger than a value of five, and even more particular larger than a value of ten.

Figure 5:
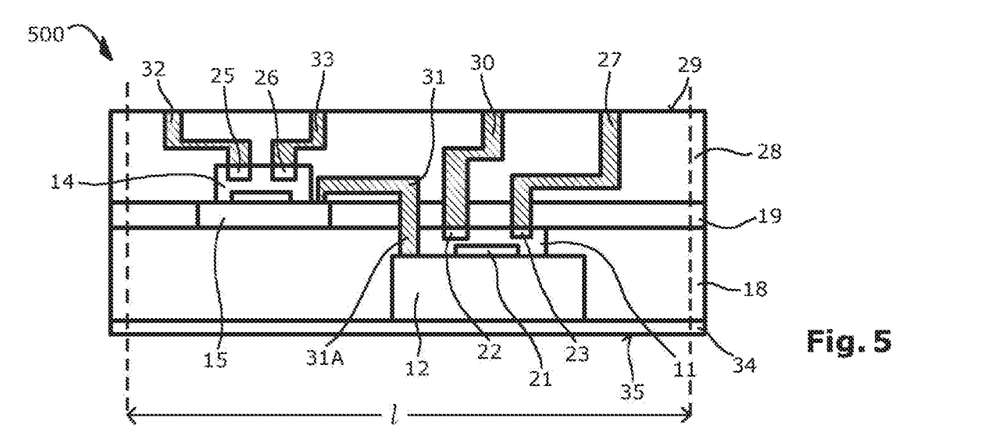
FIG. 5 schematically illustrates a cross-sectional view of a device in accordance with the disclosure.

FIG. 5 schematically illustrates a cross-sectional view of a device 500 in accordance with the disclosure. The device 500 may be similar to one of the devices 300 and 400 discussed above. Comments made in connection with previous figures may thus also hold true for FIG. 5. In contrast to the device 300 of FIG. 3G, the first semiconductor chip 11 may not necessarily correspond to a lateral semiconductor chip, but a vertical semiconductor chip that may include electrical contacts on a lower surface facing the first carrier 12 and an upper surface facing away from the first carrier 12. In FIG. 5, the electrical contact on the lower surface of the first semiconductor chip 11 may be contacted via the first carrier 12. The first semiconductor chips 11 of FIGS. 3G and 5 may have a similar electronic and/or thermal function. In a similar fashion, the lateral first semiconductor chip 11 included in the device 400 of FIG. 4 may be replaced by a vertical first semiconductor chip.

Figure 6:
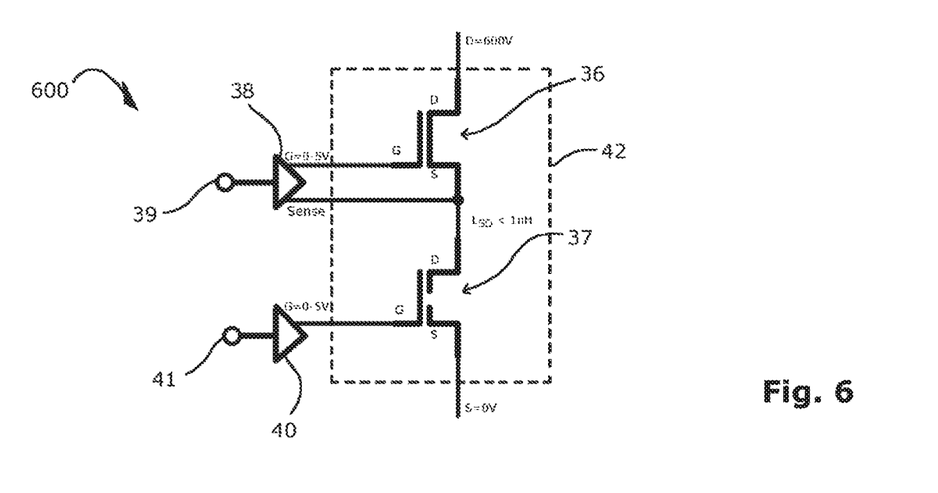
FIG. 6 illustrates a schematic diagram of a direct driven circuit.

FIG. 6 illustrates a schematic diagram of a direct driven circuit 600. For example, the direct driven circuit 600 may be implemented in form of one of the devices of FIGS. 3G, 4 and 5. The direct driven circuit 600 may include a normally on semiconductor component with a current path coupled in series with a current path of a normally off semiconductor component. For semiconductor components used as switches, it may be possible to define two different states: conduction (on-state) and isolation (off-state). A normally on component may be conductive when a voltage of zero volts is applied to a control terminal of the component, for example its gate electrode. Consequently, a normally off component may only be conductive when a finite voltage is applied to a control terminal of the component. For example, high performance devices formed of compound semiconductors may correspond to normally on devices.

In the example of FIG. 6, the direct driven circuit 600 may include a normally on JFET 36, a normally off MOSFET 37, a first driver 38, and a second driver 40. The drains, sources, and gates of the JFET 36 and the MOSFET 37 are labeled D, S, and G, respectively. The first driver 38 may have an input 39 and may be coupled to a gate of the JFET 36. For example, the first driver 38 may be configured to apply a voltage lying in a range from about 0 V to about 5 V to the gate of the JFET 36. The second driver 40 may have an input 41 and may be coupled to a gate of the MOSFET 37. For example, the second driver 40 may be configured to apply a voltage lying in a range from about 0 V to about 5 V to the gate of the MOSFET 37. A source of the MOSFET 37 may lie at a potential of about 0 V (i.e. at ground) while a drain of the JFET 36 may lie at a potential of about 600 V. An inductance $L_{SD}$ between the source of the JFET 36 and the drain of the MOSFET 37 may e.g. be smaller than 1 nH. A package 42 that may encapsulate at least a part of the direct driven circuit 600 is indicated by a dashed rectangle.

The JFET 36 may have a current path coupled in series with a current path of the MOSFET 37. In particular, the JFET 36 may include a GaN HEMT, and the MOSFET 37 may include an NMOS. Referring back to the device 300 of FIG. 3G, the JFET 36 may correspond to the first semiconductor chip 11 while the MOSFET 37 may correspond to the second semiconductor chip 14. The gate of the MOSFET 37 may be coupled to the second driver 40 to provide a normally off series arrangement of the JFET 36 and the MOSFET 37 during a transient operating condition. For example, at start up without bias voltages present, the second driver 40 may be designed to present zero volts to the gate of the MOSFET 37. Accordingly, the MOSFET 37 may be arranged to present an open circuit between its source and drain during such start up or other transient operating condition. Once bias voltages have been established by the circuit and the switching logic is in a normal operating condition, the second driver 40 may be configured to enable conduction in the MOSFET 37 in response to a signal at the input 41 of the second driver 40. The inclusion of a MOSFET 37, which may be a low-voltage device, with its current path coupled in series with the current path of the JFET 36, may add relatively little series resistance to the circuit due to the low voltage rating of a MOSFET 37 that may be used. The resistance of a MOSFET 37 may vary roughly as the inverse of the 2.5 power of its rated blocking voltage. Thus, a low voltage rated MOSFET 37 may generally exhibit low on-state resistance.

The first driver 38 may provide a signal to the gate of the JFET 36 in order to switch the JFET 36, for example with little loss at a high switching frequency. Accordingly, the first driver 38 may be configured to present a negative voltage to the gate of the JFET 36 in order to disable conduction therein during a normal operating condition of the circuit. Since the MOSFET 37 may be maintained in a fully conducting state during high-frequency switching of the JFET 36, low loss, high-frequency switching characteristics of the JFET 36 may be preserved. The first driver 38 may be configured to drive the gate of the JFET 36 with a drive voltage relative to the source of the MOSFET 37, i.e., relative to local circuit ground (see source of the MOSFET 37). Accordingly, the high-voltage blocking capability of the JFET 36 may be retained by the direct driven circuit 600 when the MOSFET 37 may be disabled to conduct, for example at startup when the gate voltage of the MOSFET 37 may be zero with respect to its source.

Summarizing operation of the direct driven circuit 600, during startup, shutdown, or a fault condition, both driver outputs may be at zero volts with respect to local ground. The small positive voltage developed at the drain of the MOSFET 37 may disable conductivity of the JFET 36, enabling the JFET 36 to be the principal circuit element blocking conductivity of the direct driven circuit. During normal high-frequency switching operation, the MOSFET 37 may be enabled to conduct by a positive voltage applied to its gate. The high-frequency switching action of the direct driven circuit may be produced by an alternating zero and negative gate-drive voltage applied to the gate of the JFET 36.

The independent control of the gate of the JFET 36 and the gate of the MOSFET 37 may maintain a low loss, high-frequency switching characteristics of a depletion-mode JFET while guaranteeing safe operation during a transient operating condition by the series current path through an enhancement-mode silicon MOSFET. An independent control of the gate of the MOSFET 37 may be used to disable conductivity of the direct driven circuit 600 during a fault condition.

Figure 7:
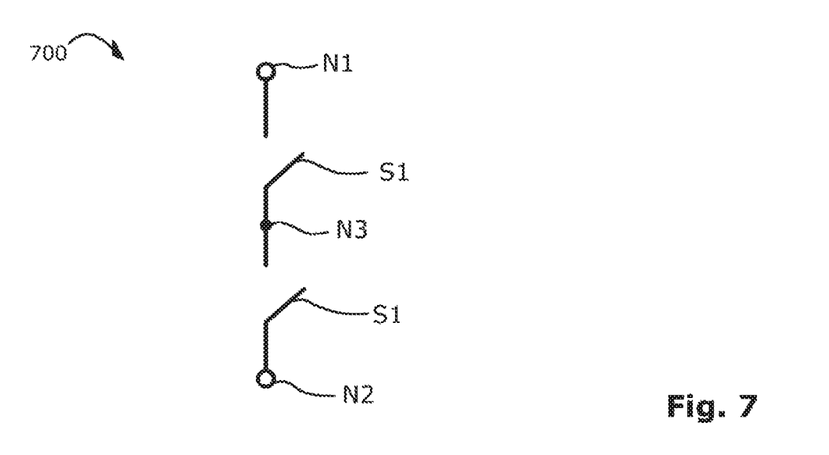
FIG. 7 illustrates a schematic diagram of a half bridge circuit.

FIG. 7 illustrates a schematic diagram of a half bridge circuit 700. The half bridge circuit 700 may be arranged between nodes N1 and N2. The half bridge circuit 700 may include switches S1 and S2 connected in series. Constant electrical potentials may be applied to the nodes N1 and N2. For example, a high potential, such as 10, 12, 18, 50, 110, 230, 500 or 1000 V or any other potential, may be applied to the node N1 and a low electrical potential, for example 0 V, may be applied to the node N2. The switches S1 and S2 may be switched at frequencies in the range from 1 kHz to 100 MHz, but the switching frequencies may also be outside this range. This means that a varying electrical potential may be applied to a node N3 arranged between the switches S1 and S2 during an operation of the half bridge. The potential of the node N3 may vary in the range between the low and the high electrical potential.

The half bridge circuit 700 may e.g. be implemented in electronic circuits for converting DC voltages, so-called DC-DC converters. DC-DC converters may be used to convert a DC input voltage provided by a battery or a rechargeable battery into a DC output voltage matched to the demand of electronic circuits connected downstream. DC-DC converters may be embodied as step down converters, in which the output voltage is less than the input voltage, or as step up converters, in which the output voltage is greater than the input voltage. Frequencies of several MHz or higher may be applied to DC-DC converters. Furthermore, currents of up to 100 A or even higher may flow through the DC-DC converters.

Since the direct driven circuit 600 of FIG. 6 may operate as a switch, the half bridge circuit 700 of FIG. 7 may be implemented based on two direct driven circuits 600. Consequently, the half bridge circuit 700 may be implemented using two devices, wherein each device may correspond to one of the devices described in connection with FIGS. 3G, 4 and 5. A device in accordance with the disclosure may be thus configured to operate as a half bridge circuit or at least a part thereof. In a similar fashion, a device in accordance with the disclosure may be configured to operate as at least a part of any other bridge circuit or a cascode circuit.

Figure 8:
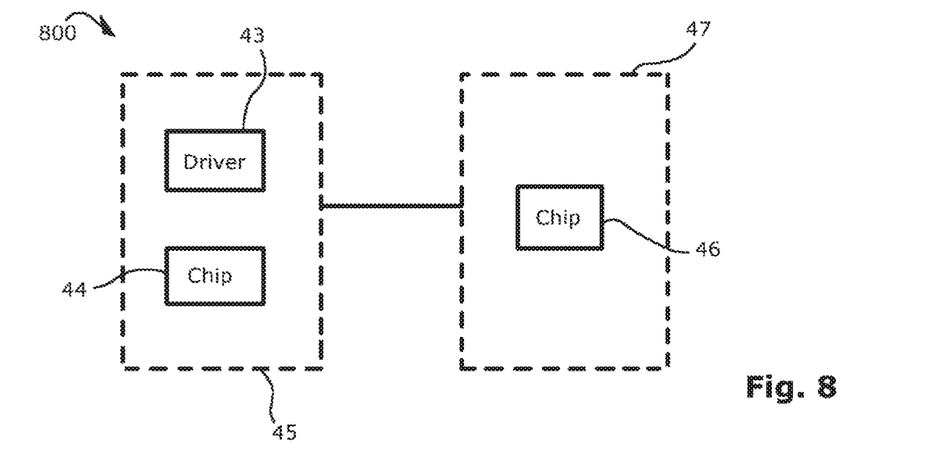
FIG. 8 schematically illustrates a cross-sectional view of a device in accordance with the disclosure.

FIG. 8 schematically illustrates a cross-sectional view of a device 800 in accordance with the disclosure. The device 800 may include a driver circuit 43 and a first semiconductor chip 44, wherein the driver circuit 43 and the first semiconductor chip 44 may be monolithically integrated in a first semiconductor material 45. The device 800 may further include a second semiconductor chip 46 that may be integrated in a second semiconductor material 47. The second semiconductor material 47 may include a compound semiconductor. A more detailed device similar to the device 800 is described in connection with FIG. 9.

In one example, the device 800 may correspond to or may be included in a direct driven circuit. Referring back to the exemplary direct driven circuit 600 of FIG. 6, the first semiconductor chip 44 of the device 800 may correspond to the MOSFET 37 of the direct driven circuit 600. In addition, the driver circuit 43 of the device 800 may correspond to one or both of the first driver 38 and the second driver 40 of the direct driven circuit 600. For example, these components may be integrated in an elemental semiconductor material, such as e.g. silicon. The second semiconductor chip 46 of the device 800 may correspond to the JFET 36 of the direct driven circuit 600. For example, this component may be integrated in a compound semiconductor material, such as GaN. In further examples, the device 800 may at least partly correspond to or may at least partly be included in at least one of a half bridge circuit, a full bridge circuit, a cascode circuit, etc.

Figure 9:
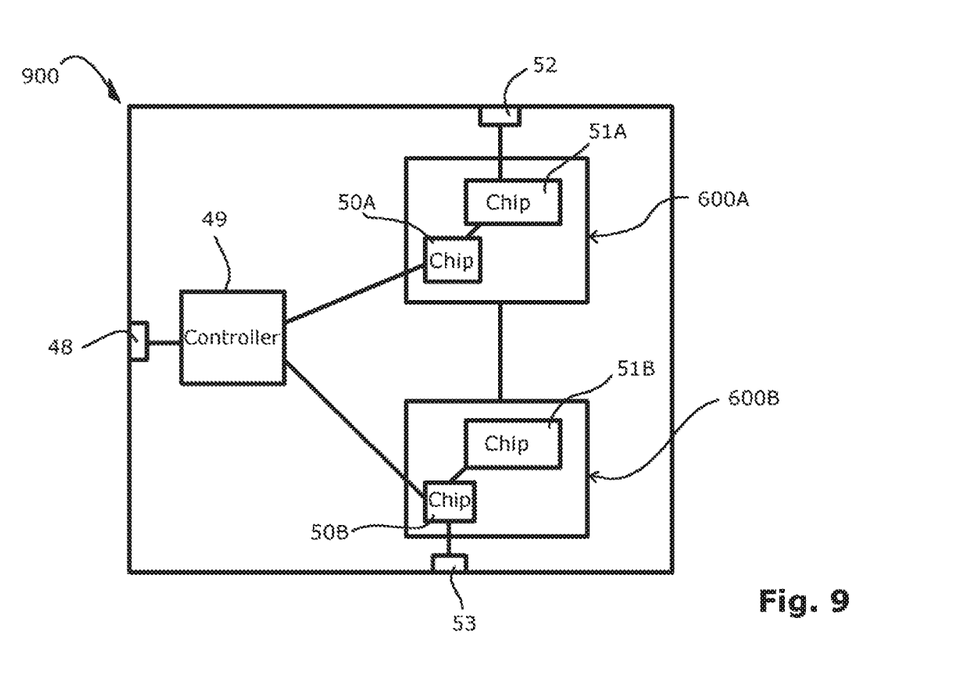
FIG. 9 schematically illustrates a cross-sectional view of a device in accordance with the disclosure.

FIG. 9 schematically illustrates a cross-sectional view of a device 900 in accordance with the disclosure. For example, the device 900 may correspond to a QFN (Quad Flat No Leads) Package and may be configured to operate as a half bridge circuit. In one example, the device 900) may at least partly correspond to the half bridge circuit 700 of FIG. 7. Comments made in connection with FIG. 7 may thus also hold true for the device 900. In the example of FIG. 9, electrical connections between the individual components of the device 900 are indicated by lines. The type of electrically conductive elements providing the electrical connections may depend on the function of the device 900. For example, each of the indicated electrical connections may include at least one of wire(s), bond wire(s), contact clip(s), etc.

The device 900 may include an input 48 that may be coupled to a control circuit 49 such that the control circuit 49 may be accessible from outside of the device 900. The control circuit 49 may include a first output that may be coupled to a first direct driven circuit 600A. In addition, the control circuit 49 may include a second output that may be coupled to a second direct driven circuit 600B. Each of the direct driven circuits 600A and 600B may be similar to the direct driven circuit 600 of FIG. 6. Comments made in connection with FIG. 6 may thus also hold true for the device of FIG. 9. In one example, the direct driven circuits 600A and 600B may be similar or identical. The direct driven circuits 600A and 600B may be located adjacent to each other, i.e. the direct driven circuit 600A may particularly be located laterally outside of an outline of the direct driven circuit 600B and vice versa.

The direct driven circuit 600A may include a first semiconductor chip 50A and a second semiconductor chip 51A. For example, the first semiconductor chip 50A may include one or more drivers (not explicitly shown) and a MOSFET (not explicitly shown) similar to the device 600 of FIG. 6. The first semiconductor chip 50A may be monolithically integrated in a semiconductor material, in particular an elemental semiconductor material, such as e.g. silicon. During an operation of the device 900, at least one of the drivers of the first semiconductor chip 50A may be controlled by the control circuit 49. The second semiconductor chip 51A may include a JFET (not explicitly shown) similar to the device 600 of FIG. 6. The second semiconductor chip 51A may be coupled to the first semiconductor chip 50A, thereby forming a direct driven circuit similar to FIG. 6. In particular, the second semiconductor chip 51A may be integrated in a compound semiconductor material such as e.g. GaN.

The device 900 may include a terminal 52 that may be coupled to the first direct driven circuit 600A, in particular to the second semiconductor chip 51A. Thus, the first direct driven circuit 600A may be accessed from outside of the device 900 via the terminal 52. The first direct driven circuit 600A may be coupled to the second direct driven circuit 600B, thereby forming a half bridge circuit. The device 900 may include a further terminal 53 that may be coupled to the second direct driven circuit 600B, in particular to the first semiconductor chip 50B. The second direct driven circuit 600B may thus be accessed from outside of the device 900 via the terminal 53.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include," "have," "with," or other variants thereof are used in either the detailed description or the claims, such terms are intended to be inclusive in a manner similar to the term "comprise," Also, the term "exemplary" is merely meant as an example, rather than the best or optimal. It is also to be appreciated that features and/or elements depicted herein are illustrated with particular dimensions relative to each other for purposes of simplicity and ease of understanding, and that actual dimensions may differ substantially from that illustrated herein.

Although specific aspects have been illustrated and described herein, it will be appreciated by those of ordinary skill in the art that a variety of alternate and/or equivalent implementations may be substituted for the specific aspects shown and described without departing from the scope of the disclosure. This application is intended to cover any adaptations or variations of the specific aspects discussed herein. Therefore, it is intended that this disclosure be limited only by the claims and the equivalents thereof.

What is claimed is:

1. A device, comprising:
   a first semiconductor chip comprising a first semiconductor material and a first power transistor device of a first direct driven circuit formed in the first semiconductor material;
   a driver circuit of the first direct driven circuit, the driver circuit being monolithically integrated with the first power transistor device in the first semiconductor material of the first semiconductor chip; and
   a second semiconductor chip comprising a second semiconductor material and a second power transistor device of the first direct driven circuit formed in the second semiconductor material, the second semiconductor material comprising a compound semiconductor.

2. The device of claim 1, further comprising a control circuit configured to control the first direct driven circuit.

3. The device of claim 1, wherein the first direct driven circuit is a cascode circuit or a half bridge circuit.

4. The device of claim 1, wherein the driver circuit is configured to control a gate electrode of the first power transistor device and a gate electrode of the second power transistor device.

5. The device of claim 1, wherein the first semiconductor chip is located laterally outside of an outline of the second semiconductor chip.

6. The device of claim 1, wherein the first semiconductor material comprises an elemental semiconductor material.

7. The device of claim 1, wherein the first semiconductor material comprises silicon and the second semiconductor material comprises gallium nitride.

8. The device of claim 1, wherein the first power transistor device is a MOSFET and the second power transistor device is a JFET.

9. The device of claim 8, wherein a current path of the MOSFET is coupled in series with a current path of the JFET.

10. The device of claim 8, wherein the MOSFET comprises an NMOS and the JFET comprises a gallium nitride HEMT.

11. The device of claim 1, wherein the first direct driven circuit is configured to operate as a switch.

12. The device of claim 1, further comprising a package configured to encapsulate at least a part of the first direct driven circuit.

13. The device of claim 1, further comprising:
   a second direct driven circuit,
   wherein the first direct driven circuit and the second direct driven circuit form a half bridge circuit.

14. The device of claim 13, further comprising a control circuit configured to control the first direct driven circuit and the second direct driven circuit.

15. The device of claim 1, wherein the driver circuit comprises a driver for the first power transistor device such that the first power transistor device and the driver for the first power transistor device are monolithically integrated in the first semiconductor material of the first semiconductor chip.

16. The device of claim 1, wherein the driver circuit comprises a driver for the second power transistor device such that the first power transistor device and the driver for the second power transistor device are monolithically integrated in the first semiconductor material of the first semiconductor chip.

17. The device of claim 1, wherein the driver circuit comprises a first driver for the first power transistor device and a second driver for the second power transistor device such that the first power transistor device, the driver for the first power transistor device and the driver for the second power transistor device are monolithically integrated in the first semiconductor material of the first semiconductor chip.

18. The device of claim 17, wherein the first power transistor device is a normally off MOSFET, and wherein the second power transistor device is a normally on JFET.

19. The device of claim 18, wherein the normally off MOSFET includes an NMOS, and wherein the normally on JFET includes a GaN HEMT.

* * * * *